United States Patent [19]

Hirao et al.

[11] Patent Number: 4,791,070

[45] Date of Patent: Dec. 13, 1988

[54] METHOD OF FABRICATING A SOLID STATE IMAGE SENSING DEVICE

[75] Inventors: Tadashi Hirao; Shigeto Maekawa, both of Itami, Japan

[73] Assignee: Mitsubishi Denki Kabushiki Kaisha, Tokyo, Japan

[21] Appl. No.: 11,508

[22] Filed: Feb. 6, 1987

Related U.S. Application Data

[62] Division of Ser. No. 627,469, Jul. 3, 1984, Pat. No. 4,665,422.

[30] Foreign Application Priority Data

Aug. 20, 1983 [JP] Japan ................. 58-151948

[51] Int. Cl.$^4$ .................. H01L 27/14; H01L 31/00
[52] U.S. Cl. ........................... 437/2; 437/59
[58] Field of Search .......... 437/2, 59; 357/30, 24 LR, 357/34, 23.1, 23.11, 31, 40, 43; 307/446, 457; 358/212, 213

[56] References Cited

U.S. PATENT DOCUMENTS

| | | |
|---|---|---|
| 3,946,151 | 3/1976 | Kamiyama et al. |
| 4,148,048 | 4/1979 | Takemoto et al. |
| 4,183,034 | 1/1980 | Burke et al. |
| 4,316,205 | 2/1982 | Aoki et al. ............................. 357/30 |
| 4,402,003 | 8/1983 | Blanchard ............................. 357/43 |

FOREIGN PATENT DOCUMENTS

| | | |
|---|---|---|
| 0020233 | 12/1980 | European Pat. Off. |
| 0046396 | 2/1982 | European Pat. Off. |
| 2938499 | 4/1980 | Fed. Rep. of Germany |
| 3006267 | 8/1980 | Fed. Rep. of Germany |
| 3003992 | 9/1980 | Fed. Rep. of Germany |
| 3008858 | 9/1980 | Fed. Rep. of Germany |
| 3036905 | 4/1981 | Fed. Rep. of Germany |
| 3329095 | 2/1984 | Fed. Rep. of Germany |
| 3345200 | 6/1984 | Fed. Rep. of Germany |

OTHER PUBLICATIONS

IEEE Transactions on Electron Devices, vol. ED-29, No. 10, Oct. 1982, pp. 1637–1639.

Primary Examiner—Brian E. Hearn
Assistant Examiner—Mary A. Wilczewski
Attorney, Agent, or Firm—Lowe, Price, LeBlanc, Becker & Shur

[57] ABSTRACT

A solid state image sensor including a photoelectric transducing diode (PD) formed on an n-type semiconductor substrate (1) and a MOS transistor (TRs). A signal photoelectrically transduced by the diode (PD) is amplified by a pnp-type transistor (TRa) formed on the substrate and between the diode (PD) and the MOS transistor (TRa). The amplified signal is read out by the MOS transistor. The source (4) of the MOS transistor is connected to the emitter (21) of the pnp-type transistor partly by a polysilicon (91).

4 Claims, 4 Drawing Sheets

METHOD OF FABRICATING A SOLID STATE IMAGE SENSING DEVICE

This is a division, of application Ser. No. 627,469, filed July 3, 1984 now U.S. Pat. No. 4,665,422.

BACKGROUND OF THE INVENTION

1. Field of the Invention

The present invention relates to a solid state image sensing device and a manufacturing process thereof, and more particularly, it relates to a solid state image sensing device whose photosensitivity is improved by provision of a transistor for amplifying signals between a photoelectric transducing diode and a MOS metal oxide semiconductor switching transistor and a process of manufacturing the same.

2. Description of the Prior Art

Conventional solid state (semiconductor) image sensors (hereinafter referred to as "SIS") have been restricted to a MOS type and a CCD type. FIG. 1 shows an equivalent circuit diagram of a fundamental cell (hereinafter referred to as "cell") forming a picture element of a commercially available MOS type SIS and a circuit diagram of a transistor connected thereto for reading signals.

Referring to FIG. 1, the cell comprises a photoelectric transducing diode (photodiode) PD and a MOS switching transistor TRs. The photoelectric charge generated by incidence of a light in the photodiode PD is stored in an interconnection capacity $C_V$ by turning-on of a signal reading MOS transistor TRs, whose voltage is generated as a video output. A transistor TRp as shown by the phantom line in FIG. 1 functions to extract an overcurrent caused by an oversaturated light.

FIG. 2 is a time chart of a video output current. Since the interconnection capacity $C_V$ is smaller than 1/100 of the capacity $C_H$, the signal current is made to be a fine current superposed on a clock noise as shown in FIG. 2, whereby the dynamic range of the video output is significantly restricted. Thus, it is necessary to enlarge the area of the photodiode PD, for providing sufficient photoelectric conversion current.

FIG. 3 is a cross-sectional view showing a cell of the conventional MOS type SIS as shown in the equivalent circuit of FIG. 1 and partially showing cells adjacent to both sides thereof.

Structure of the cell of the conventional MOS type SIS as shown in FIG. 3 is now described. In FIG. 3, a p-type well 2, functioning as an anode of the photodiode PD, is formed on an n⁻-type substrate 1, and selectively formed on the surface of the p-type well 2 is an n+ layer 3 which is a cathode of the photodiode PD while functioning as a source of the MOS switching transistor TRs. Further, the p-type well 2 is provided therein with an n+ layer 4 which functions as a drain of the MOS switching transistor TRs, such that a channel forming region is defined between the same and the n+ layer 3. An oxide film 5 is deposited on the p-type well 2, including the n+ layers 3 and 4, and a gate electrode 6, formed by polycrystal silicon, is provided on a gate oxide film, which is a part of the oxide film 5 located on the channel forming region of the MOS switching transistor TRs. Then, a layer insulating film 7 is formed over the oxide film 5 including the gate electrode 6, and a drain electrode 8 is provided in an opening formed through the oxide film 5 and the layer insulating film 7, to be in contact with the n+ layer 4. The gate electrode 6 is connected to an interlace circuit (not shown) while the drain electrode 8 is connected to the signal reading MOS transistor TRo (not shown in FIG. 3). The n+ layer 3, the p-type well 2 and the n⁻-type substrate 1 of the photodiode PD form the transistor TRp as shown by the phantom line in FIG. 1, which functions to extract an overcurrent caused by an oversaturated light.

Operation of the cell of the conventional MOS type SIS as shown in FIG. 3 is now described. When the photodiode PD formed by the p-type well 2 and the n+ layer 3 receives a light, a photoelectric charge is generated to be stored in the junction capacitance. Then the gate electrode 6 connected to the interlace circuit is turned on so that a current flows from the n+ layer 3, which is the source of the MOS switching transistor TRs, to the n+ layer 4 which is the drain of the MOS switching transistor TRs, to be fed through the drain electrode 8 to the signal reading MOS transistor TRo (not shown), which in turn is turned on to provide a video signal corresponding to the optical signal amount.

In the meantime, it is necessary to enlarge the area of the n+ layer 3 which is the cathode of the photodiode PD, for increasing the photoelectric current, namely, for increasing photosensitivity as hereinabove described.

However, since the incident area of the light to the SIS is determined by the optical system such as a lens, the area of the cell with a predetermined number of picture elements is inevitably limited, whereby the cathode area cannot be freely enlarged. Although it can be considered to amplify the output from the drain of the MOS switching transistor TRs for improving the photosensitivity, clock noises and fixed pattern noises are also amplified, leading to ineffective increase of the photosensitivity.

SUMMARY OF THE INVENTION

Accordingly, an essential object of the present invention is to overcome the aforementioned disadvantage of the prior art, by providing a solid state image sensing device whose photosensitivity is improved with density of integration comparable to that of the prior art and a process of manufacturing the same.

The present invention comprises a solid state image sensing device including an n-type semiconductor substrate, a photoelectric transducing diode having a p-type anode and an n-type cathode formed on the n-type semiconductor substrate, a metal oxide semiconductor type of switching transistor formed on the substrate, having source, drain and gate regions, for selectively providing a signal current generated in the photoelectric transducing diode upon incidence of a light, and a pnp-type transistor formed on the n-type semiconductor substrate and between the photoelectric transducing diode and the metal oxide semiconductor switching transistor for amplifying the signal current. The source region of the metal oxide semiconductor switching transistor is connected to the emitter of the pnp-type transistor partly by a material having an insulating surface. The solid state image sensing device further includes a conductor connected to the drain of the metal oxide semiconductor switching transistor. The conductor is disposed on the insulating material. Preferably, the conductor is disposed perpendicularly crossing the insulating material.

The present invention further comprises a process of manufacturing a solid state image sensing device, including the steps of preparing a low-density n-type semiconductor substrate, forming a p-type semiconductor region in the low-density n-type semiconductor substrate, selectively forming a first n-type layer in the p-type semiconductor region, forming a first electrode in said p-type semiconductor region, forming high-density second, third and fourth n-type layers in the p-type semiconductor region, forming a high-density p-type layer in the first n-type layer, defining contact windows in the third and fourth n-type layers, performing interconnection from the contact of the third n-type layer to the vicinity of the high-density p-type layer by a first connecting means having an insulating surface, defining a contact window in the high-density p-type layer, and performing interconnection from the first connecting means to the contact of the high-density p-type layer by a second connecting means of a low-resistance metal.

The aforementioned object and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
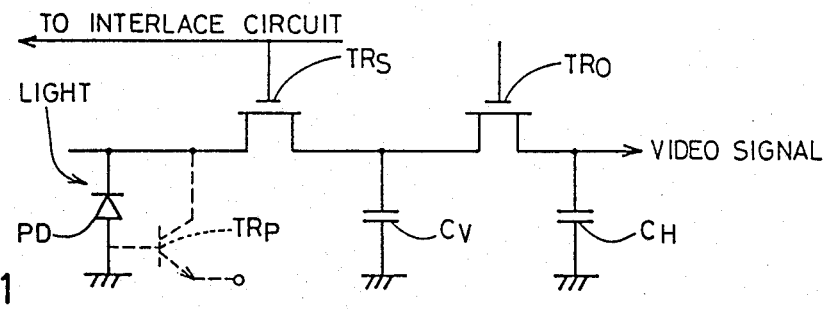
FIG. 1 is an equivalent circuit diagram showing a conventional MOS type solid state image sensor.
Figure 2:
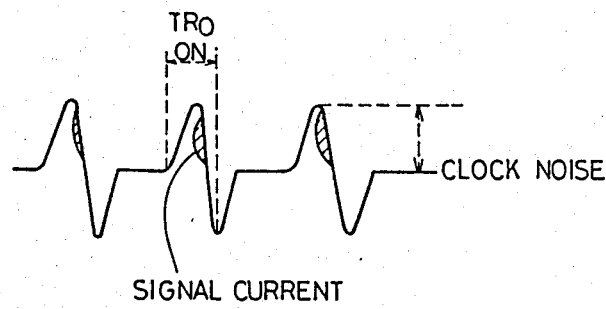
FIG. 2 is a time chart showing a video output signal of the conventional solid state image sensor as shown in FIG. 1.
Figure 3:
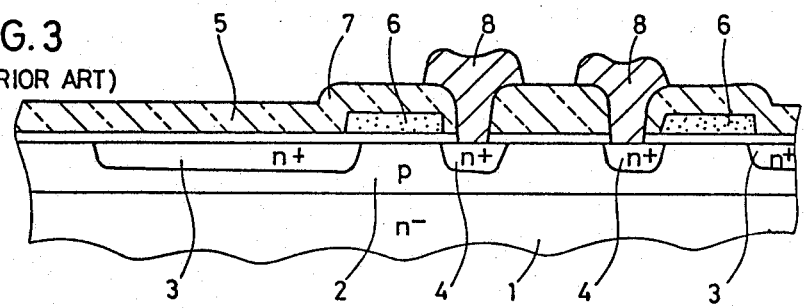
FIG. 3 is a typical cross-sectional view of the conventional solid state image sensor.
Figure 4:
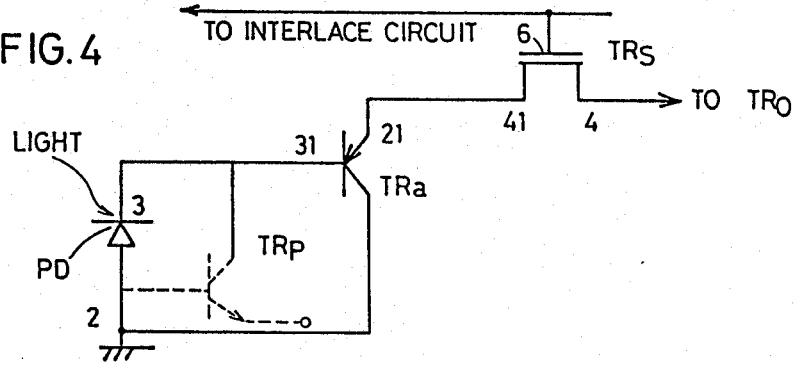
FIG. 4 is an equivalent circuit diagram showing the principle of the present invention.

FIG. 4 is an equivalent circuit diagram showing the principle of a cell of a solid state image sensor according to an embodiment of the present invention.

Referring to FIG. 4, structure of the equivalent circuit is now described. A cathode 3 of a photoelectro transducing diode PD is connected to a base 31 of a pnp-type signal amplifying transistor TRa, whose emitter 21 in turn is connected to a source 41 of a MOS switching transistor TRs and a collector thereof is grounded in common with an anode 2 of the photoelectro transducing diode PD. A gate 6 of the MOS switching transistor TRs is connected to an interlace circuit (not shown), and a drain 4 thereof is connected to a signal reading MOS transistor TRo (not shown). A transistor TRp as shown by the phantom line in FIG. 4 functions to extract an overcurrent caused by an oversaturated light.

Now, operation of the equivalent circuit as shown in FIG. 4 is described. When the photoelectro transducing diode PD receives a light, an electron-hole pair is generated and an electric charge in an amount proportional to an optical signal amount is stored in a junction capacitance, which stored electric charge is injected, as a photoelectric conversion signal, into the base 31 of the signal amplifying transistor TRa. At this time, the generated hole is not injected as the electron due to difference in lifetime and mobility, and is trapped halfway. When, in this case, the MOS switching transistor TRs is turned on, the emitter 21 of the signal amplifying transistor TRa connected to the source 41 of the MOS switching transistor TRs extracts a current in an amplification factor $\beta$ times of that of the electric charge injected into the base 31, to provide a current source for outputting a video signal to the drain 4 of the MOS switching transistor TRs.

Figure 5:
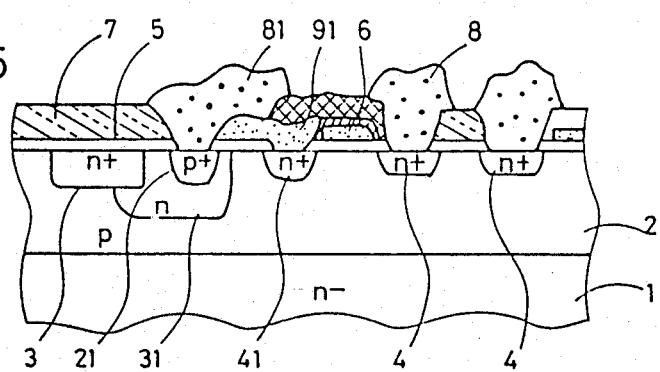
FIG. 5 is a typical cross-sectional view of an embodiment of the present invention.

FIG. 5 is a typical cross-sectional view showing a cell of the solid state image sensor embodying the present invention. Structure of the embodiment as shown in FIG. 5 is now described. Formed on an n⁻-type substrate 1 is a p-type well 2 which functions as an anode of the photoelectro transducing diode PD. The p-type well 2 is formed therein with an n+ layer 3 which is a cathode of the photoelectro transducing diode PD, an n-type layer 31 which is a base of the signal amplifying transistor TRa, a p+ layer 21 which is an emitter of the signal amplifying transistor TRa, an n+ layer 41 which is a source of the MOS switching transistor TRs and an n+ layer 4 which is a drain of the MOS switching transistor TRs. An oxide film 5 is formed on the p-type well 2, while a gate electrode 6 is formed on a channel forming region of the MOS switching transistor TRs. A polysilicon film 91 is formed on an opening of the source 41, while an aluminum interconnector 81 is provided on an opening of the emitter 21 and a drain electrode 8, also comprising an aluminum interconnector, is provided on an opening of the drain 4.

The gate electrode 6 is connected to an interlace circuit (not shown) and the drain electrode 8 is connected to the signal reading MOS transistor TRo (not shown).

Operation of the embodiment as shown in FIG. 5 is now described. When the photoelectro transducing diode PD formed by the p-type well 2 and the n+ layer 3 receives a light, an electron-hole pair is generated to be stored in a junction capacitance, and the stored electric charge is amplified in the signal amplifying transistor TRa formed by the n-type layer 31 (base), the p+ layer 21 (emitter) and the p-type well 2 (collector) to $\beta$ times in current amplification factor. The amplified signal is transmitted from the emitter 21 through th aluminum interconnector 81 and the polysilicon film 91 having an insulating surface to the n+ layer 41 which is a source of the MOS switching transistor TRs. The signal current is read by turning-on of the MOS switching transistor TRs formed by the n+ layer 41, the gate electrode 6 and the n+ layer 4 which is a drain, to be fed through the drain electrode 8 to the signal reading MOS transistor TRo (not shown), which, in turn, is turned on to provide a video signal corresponding to the optical signal amount.

The reason why a pnp-type transistor is used here as the signal amplifying transistor TRa is that the storage effect of the photoelectro transducing diode PD can be sufficiently effectuated since, in case of a pnp transistor, the signal amplifying transistor TRa is not turned on by the electric charge injected into the base 31 alone unless the MOS switching transistor TRs is turned on. In other words, if an npn transistor is used as the signal amplifying transistor TRa, when the electric charge injected into the base (p-type layer) exceeds the barrier (0.6 to 0.8 V) with the emitter (n-type layer), the injected electric charge leaks regardless of the on and off states of the MOS switching transistor TRs, leading to incapability of storage over a certain amount of the electric charge generated by photoelectro transducing in the photodiode PD.

Further, the reason why the signal amplifying transistor TRa is vertically structured is that, in a lateral transistor, the current amplification factor $\beta$ is about 2 to 5 times and is hard to be increased thereover, and the base width varies with the photolithographic accuracy leading to significant variation in the amplification factor $\beta$. Therefore, vertical structure is employed for obtaining a high amplification factor $\beta$ in good accuracy.

Figure 6:
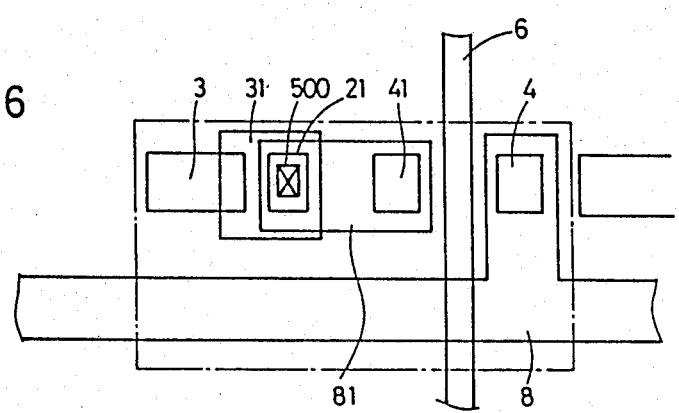
FIG. 6 is a plan view of a cell of the present invention according to a conventional manufacturing process.
Figure 7:
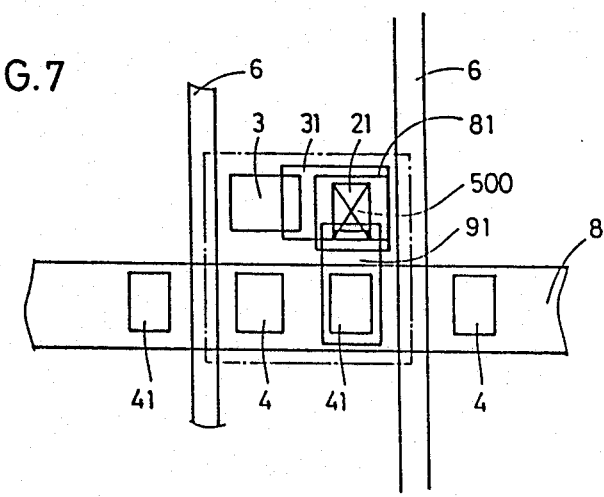
FIG. 7 is a plan view of a cell according to a manufacturing process of the present invention.

Description is now made with respect to density of integration of the embodiment as shown in FIG. 5. FIG. 6 is a plan view showing a cell manufactured by aluminum interconnection which is a conventional manufacturing process, and FIG. 7 is a plan view of a cell in which a polysilicon film according to a manufacturing process of the present invention is used.

When, in the FIG. 5 embodiment, the emitter 21 of the signal amplifying transistor TRa and the source 41 of the MOS switching transistor TRs are connected by the conventionally used aluminum interconnector 81, a layer insulating film must be provided on the aluminum interconnector 81 for passing the drain electrode 8, which is also an aluminum interconnector, over the source 41. Consequently, the process is complicated such that two-layer interconnection must be provided on the aluminum interconnector 81, leading to difficulty in realization requiring detoured interconnection of the drain 4 as shown in FIG. 6. Thus, application of such an aluminum interconnector 81 is meaningless in practice since the area of the signal amplifying transistor TRa and the aforementioned aluminum interconnection region are increased, although the area of the photoelectro transducing diode PD is made small in comparison with the conventional MOS type solid state image sensor.

Accordingly, as shown in FIG. 5, the electrode is extracted from the source 41 by the polysilicon layer 91 which has an insulating surface so that interconnection is performed by the polysilicon film 91 to the vicinity of the emitter contact of the signal amplifying transistor TRa which is separated from the region of the source 41, and thereafter interconnection is performed by the aluminum electrode 81 to be connected to the emitter 21, thereby enabling passing of an aluminum interconnector 8 of the drain 4 over the source 41, so as to maintain density of integration comparable to that of the conventional image sensor.

Description is now made with respect to a process of manufacturing the solid-state image sensor according to the present invention.

FIGS. 8A to 8G shows explanatory cross-sectional views showing the process of manufacturing the solid state image sensor embodying the present invention in order of steps.

Figure 8A:
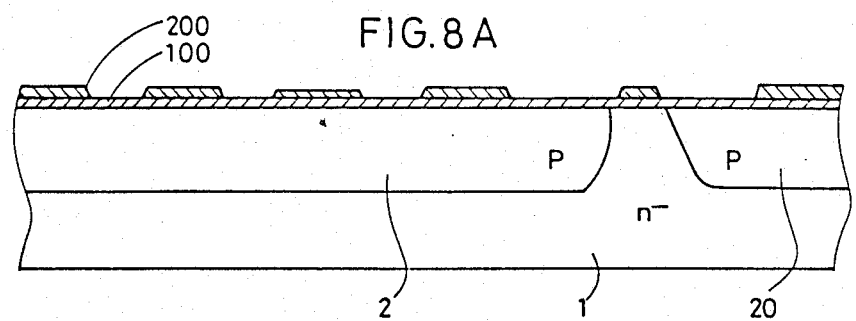
FIGS. 8A to 8G show explanatory cross-sectional views showing a process of manufacturing a solid-state image sensor embodying the present invention.

First, as shown in FIG. 8A, p-type wells 2 and 20 are provided in an n⁻-type substrate 1, and formed thereon is an underlying oxide film 100, on which a nitride film 200 is selectively deposited.

Figure 8B:
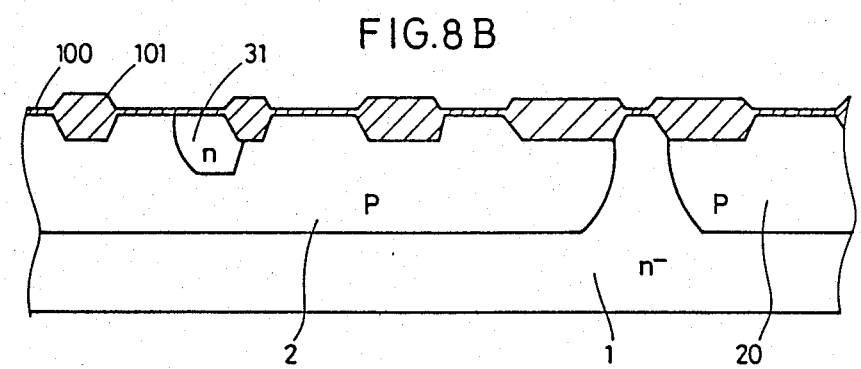

Then, as shown in FIG. 8B, selective oxidation is performed utilizing the nitride film 200 as a mask, to form a thick field oxide film 101. Thereafter, the nitride film 200 is fully removed to provide a resist film (not shown). An n-type impurity such as arsenic and phosphor is subjected to ion injection utilizing the resist film as a mask, and thereafter annealing is performed to provide an n-type layer 31 which functions as a base of a pnp-type signal amplifying transistor TRa.

Figure 8C:
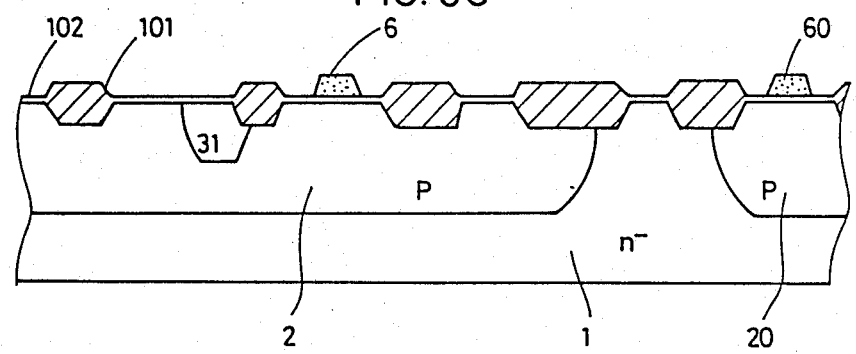

Next, as shown in FIG. 8C, the underlying oxide film 100 is fully removed to form a gate oxide film 102, on which, in turn, n-type polysilicon films 6 and 60 functioning as gate electrodes of a MOS transistor TRs are provided.

Figure 8D:
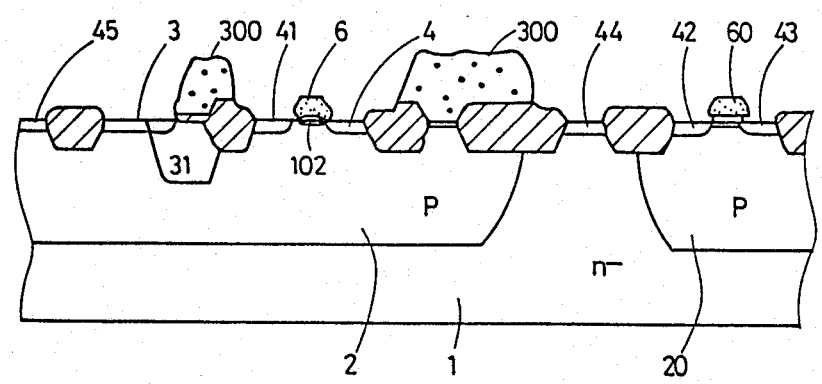

Then, as shown in FIG. 8D, a resist film 300 is selectively provided so that the gate oxide film 102 are removed except for the portion on which the film 300 is provided, and an n-type impurity is injected utilizing the resist film 300 as a mask, thereby forming n+ layers of a source 41, a drain 4 and a cathode 3 of the MOS transistor. An n+ layer 44 formed in a similar manner thereto is a region for extracting the substrate.

Figure 8E:
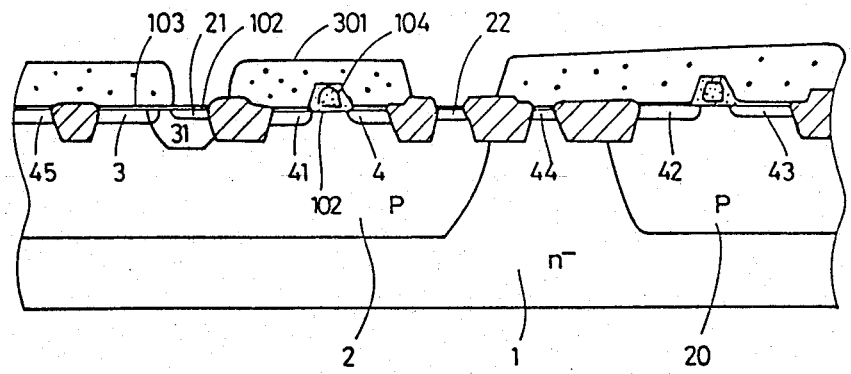

Next, as shown in FIG. 8E, the source 41 and the drain 4 are formed in a self-aligned manner utilizing the polysilicon films 6 and 60 as masks. Formed thereafter is an oxide film 103, which may be formed during annealing of the aforementioned n+ layers in FIG. 8D. Further, the polysilicon film, which is a gate electrode, is simultaneously provided thereon with an oxide film 104. Then a resist film 301 is formed to be used as a mask for performing ion injection of a p-type impurity through the gate oxide film 102, thereby forming an emitter layer 21 of the signal amplifying transistor TRa. At this time, injection of a p-type impurity is simultaneously performed also to a region 22 for extracting a well potential.

Figure 8F:
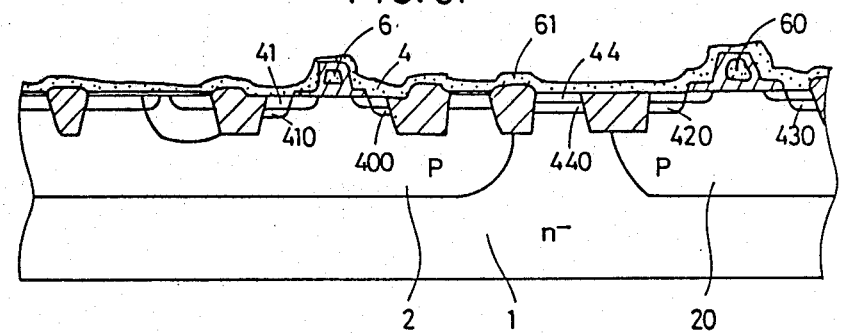

Then, as shown in FIG. 8F, portions of the oxide film 103 located on the source 41, the drain 4 and the substrate electrode extracting region 44 are selectively removed for defining contact windows, on which a polysilicon film 61 is fully deposited. Thereafter, phosphor deposition is further performed over the entire surface, to make the above polysilicon film 61 an n+ type. At this time, the surface of the substrate is also subjected to phosphor deposition, for performance of phosphor gettering. By virtue of this, the aforementioned n+ type polysilicon film 61 is diffused in the p-type well 2, so that n+ layers 400, 410, 420, 430 and 440 are formed for facilitating further sufficient contact in the aforementioned regions.

Figure 8G:
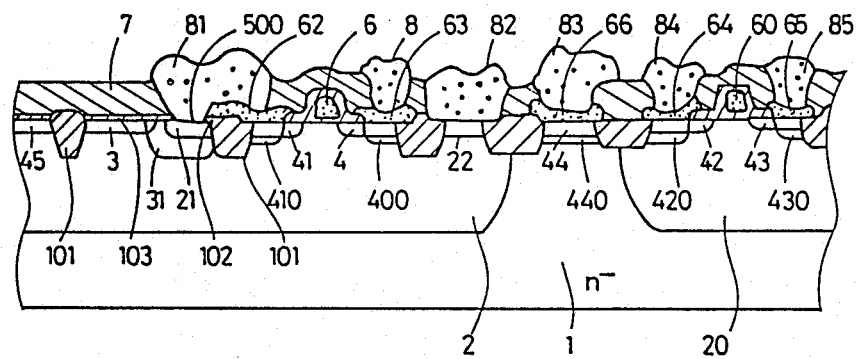

Then, as shown in FIG. 8G, the polysilicon film 61 is subjected to selective etching, to form a passivation film 7 for defining contact windows on the emitter 21, the drain 4, the well potential extracting region 22 and the substrate electrode extracting region 44. Further, interconnectors 8, 81, 82, 83, 84 and 85 of a low-resistance metal (aluminum) are applied to the aforementioned contact windows. The polysilicon films 62 and 63 are left to cover the source 41, the drain 4 and the substrate electrode extracting region 44, while the polysilicon film 62 on the source contact is further left to be connected with the vicinity of the emitter 21 of the signal amplifying transistor TRa. Further, a contact window 500 of the emitter 21 functions to define a window in a part of the emitter 21 and the polysilicon film 62 extended to the vicinity of the emitter 21 as hereinabove described and connected with the source 41. The emitter 21 and the source 41 are connected through the polysilicon film 62 with each other by the aforementioned aluminum interconnector 31.

As hereinabove described, interconnection of the emitter 21 and the source 41 is partially performed by the polysilicon film 62 to pass the aluminum interconnector from the drain 4 over the region of the source 41, whereby the area of the cell can be made remarkably small, as shown by the one-dot chain line in FIG. 7, in comparison with that in a case where only the aluminum interconnection is performed. In other words, by such high integration, the signal amplifying transistor according to the present invention can be assembled into the solid state image sensor, whose photosensitivity is significantly improved.

With respect to the contact window 500 of the emitter 21 as shown in FIG. 8G, the polysilicon film 62 is extended over the field oxide film 101 on the active region, so that the left oxide film 102 prevents the aluminum interconnector 81 from abnormally diffusing from the interface of the field oxide film 101 to short-circuit to the base 31 and the collector 2. However, if such abnormal diffusion of the aluminum interconnector 81 is prevented by, e.g., providing a barrier metal of Pt-SI/-TIW under the same, the polysilicon film 62 may be extended only to the upper portion of the field oxide film 101, so that defining of a contact window in the emitter 21 is performed in a walled contact manner.

In forming of the passivation film 7, a part of the surface of the polysilicon film 62, which functions as an layer insulating film between the aluminum interconnector 8 and the polysilicon film 62 on the source region, may be oxidized to reinforce insulatability, and the passivation film 7 may be formed in multilayer structure of a non-doped film and a film of phospho-silicate glass (PSG).

Further, the polysilicon film 62 may be formed by an amorphous silicon film or an epitaxially grown crystal or polycrystal film, whereby an effect similar to the above can be obtained.

As hereinabove described, since, according to the present invention, a signal amplifying transistor is provided between a photoelectro transducing diode and a MOS switching transistor, photosensitivity can be remarkably improved in comparison with a conventional solid state image sensor, and further, high integration can be realized since interconnection of the signal amplifying transistor and the MOS switching transistor is partially performed by an interconnecting material having an insulating surface.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A process of manufacturing a solid state image sensing device, comprising the steps of:
    preparing a low-density n-type semiconductor substrate;
    forming a p-type semiconductor region in said low-density n-type semiconductor substrate;
    selectively forming a first n-type layer in said p-type semiconductor region;
    forming a first electrode on an insulating layer situated on said p-type semiconductor region;
    forming high-density second, third and fourth n-type layers in said p-type semiconductor region;
    forming a high-density p-type layer in said first n-type layer;
    defining contact windows to said third and fourth n-type layers;
    performing interconnection from the contact of said third n-type layer to the vicinity of said high-density p-type layer by a first connecting means having an insulating surface;
    defining a contact window in said high-density p-type layer; and
    performing interconnection from said first connecting means to the contact of said high-density p-type layer by a second connecting means of a low-resistance metal.

2. A process of manufacturing a solid state image sensing device in accordance with claim 1, wherein said first electrode is a polysilicon film.

3. A process of manufacturing a solid state image sensing device in accordance with claim 1, wherein said first connecting means is a polysilicon film, an amorphous silicon film or an epitaxially grown crystal or polycrystal film.

4. A process of manufacturing a solid state image sensing device in accordance with claim 1, wherein said step of defining contact windows in said third and fourth n-type layers includes first depositing a polysilicon film over said third and fourth n-type layers and further conducting phosphor deposition thereover for making said polysilicon film an n-type.

* * * * *